(12) United States Patent
Parker et al.

(10) Patent No.: US 8,638,633 B2
(45) Date of Patent: Jan. 28, 2014

(54) APPARATUS AND METHOD FOR EXTERNAL CHARGE PUMP ON FLASH MEMORY MODULE

(75) Inventors: Allan Parker, Austin, TX (US); Ali Pourkeramati, Santa Cruz, CA (US); Arthur Benjamin Oliver, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 134 days.

(21) Appl. No.: 13/098,389

(22) Filed: Apr. 29, 2011
(Under 37 CFR 1.47)

(65) Prior Publication Data
US 2012/0275229 A1    Nov. 1, 2012

(51) Int. Cl.
*G11C 5/14*    (2006.01)
(52) U.S. Cl.
USPC .................. 365/226; 365/51; 365/185.33

(58) Field of Classification Search
USPC .................. 365/189.09, 226, 51, 185.33
See application file for complete search history.

(56) References Cited

U.S. PATENT DOCUMENTS

| | | | |
|---|---|---|---|
| 7,324,374 B2 | 1/2008 | Shieh et al. | |
| 7,701,797 B2 * | 4/2010 | Cornwell et al. | 365/226 |
| 8,468,379 B2 * | 6/2013 | Trantham | 713/340 |
| 2006/0285418 A1 * | 12/2006 | Aoki | 365/226 |
| 2012/0250443 A1 * | 10/2012 | Saraswat et al. | 365/226 |

* cited by examiner

*Primary Examiner* — Vanthu Nguyen
(74) *Attorney, Agent, or Firm* — Sterne, Kessler, Goldstein & Fox P.L.L.C.

(57) ABSTRACT

A memory module is provided. The memory module includes die packages and a charge pump that is external the die packages. Each die package includes a flash memory device, and each of the flash memory devices includes bit lines and memory cells coupled to the bit lines. The charge pump provides a charge pump voltage that is selectively provided to the bit lines in each flash memory device in each of the die packages.

12 Claims, 4 Drawing Sheets

APPARATUS AND METHOD FOR EXTERNAL CHARGE PUMP ON FLASH MEMORY MODULE

TECHNICAL FIELD

The invention is related to computer-readable memory, and in particular, but not exclusively, to an apparatus and method for an external high-voltage charge pump built on a flash memory module.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. An oxide-nitride-oxide (ONO) dielectric layer formed over top of the substrate and bit lines. The nitride serves as the charge storage layer between two insulating layers. Word lines are then formed over top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different types of flash memory, including NOR flash and NAND flash.

BRIEF DESCRIPTION OF THE DRAWINGS

Non-limiting and non-exhaustive embodiments of the present invention are described with reference to the following drawings, in which.

DETAILED DESCRIPTION

Figure 1:
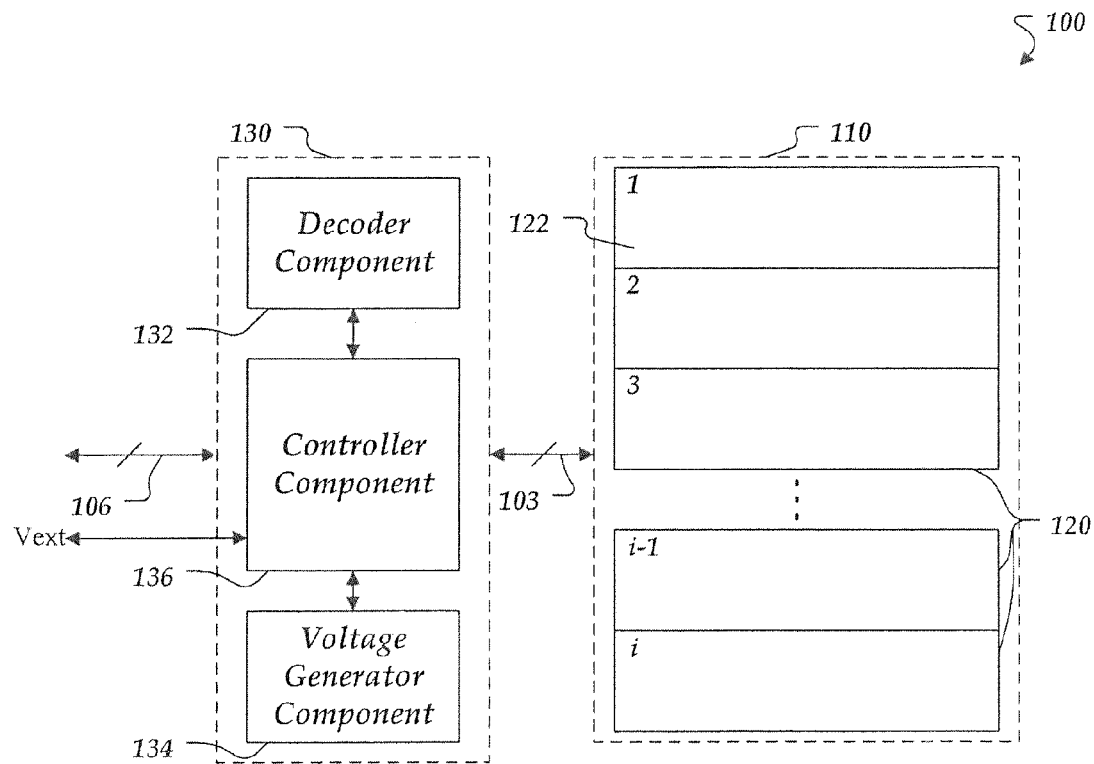
FIG. 1 illustrates a block diagram of an embodiment of a memory.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "signal" means at least one current, voltage, charge, temperature, data, or other signal.

Briefly stated, the invention is related to a memory module that includes die packages and a charge pump that is external the die packages. Each die package includes a flash memory device, and each of the flash memory devices include bit lines and memory cells coupled to the bit lines. The charge pump provides a charge pump voltage that is selectively provided to the bit lines in each flash memory device in each of the die packages.

FIG. 1 shows a memory environment in which embodiments of the invention may be employed. Not all the components illustrated in the figures may be required to practice the invention, and variations in the arrangement and type of the components may be made without departing from the spirit or scope of the invention. For example, although some embodiments of the invention described in the context of a MirrorBit™ NOR flash memory, the fabrication described herein may be employed in manufacturing other types of microelectronic memories or devices such as other various types of flash memory.

As shown, memory 100 includes arrayed memory 110 and memory controller 130. Memory controller 130 is arranged to communicate addressing data and program data over signal path 106. For example, signal path 106 can provide 8, 16, or more I/O lines of data. Memory controller 130 is also configured to access arrayed memory 110 over signal path 103. For example, memory controller 130 can read, write, erase, and perform other operations at portions of arrayed memory 110 via signal path 103. In addition, although shown as single lines, signal path 103 and/or signal path 106 may be distributed across a plurality of signal lines and/or bus lines.

Arrayed memory 110 includes memory sectors 120 (identified individually as sectors 1-*i*) that can be accessed via memory controller 130. Memory sectors 120 can include, for example, 256, 512, 1024, 2048 or more sectors having memory cells that can be individually or collectively accessed. In other examples, the number and/or arrangement of memory sectors can be different. In one embodiment, for example, sectors 120 can be referred to more generally as memory blocks and/or can be configured to have a configuration that is different than a bit line, word line, and/or sector topology.

Memory controller 130 includes decoder component 132, voltage generator component 134, and controller component 136. In some embodiments, memory controller 130 may be located on the same chip as arrayed memory 110. In other examples, other implementations of memory controller 130 are possible. For example, memory controller 130 can include a programmable microcontroller.

Decoder component 132 is arranged to receive memory addresses via addressing signal path 106 and to select individual sectors, arrays, or cells according to the architecture of arrayed memory 110.

Decoder component 132 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 110 and another portion (or another grouping of bits) can identify a core cell array within a particular sector.

Voltage generator component 134 is arranged to receive one or more supply voltages (not shown) and to provide a variety of reference voltages required for reading, writing, erasing, pre-programming, soft programming, and/or under-erase verifying operations. For example, voltage generator component 134 can include one or more cascode circuits, amplifier circuits, regulator circuits, and/or switch circuits that can be controlled by controller component 136. Some supply voltages for memory 100 are supplied by voltage generator component 134, which is on-chip, but at least one voltage, external voltage Vext, is provided externally.

Controller component 136 is arranged to coordinate reading, writing, erasing, and other operations of memory 100. In one embodiment, controller component 136 is arranged to receive and transmit data from an upstream system controller (not shown). Such a system controller can include, for example, a processor and a static random access memory (SRAM) that can be loaded with executable processor instructions for communicating over signal path 106. In another embodiment, controller component 136 as well as other portions of memory controller 130 may be embedded or otherwise incorporated into a system controller or a portion of a system controller.

Embodiments of controller component 136 can include a state machine and/or comparator circuits. State machine and comparator circuits can include any of a variety of circuits for invoking any of a myriad of algorithms for performing reading, writing, erasing, or other operations of memory 100. State machines and comparator circuits can also include, for example, comparators, amplifier circuits, sense amplifiers, combinational logic, or the like.

In some embodiments, memory 100 is a flash-based memory including flash-based memory cells, such as flash-based NAND cells, NOR cells, or hybrids of the two. In some embodiments, memory 100 is a MirrorBit™ flash memory.

Figure 2:
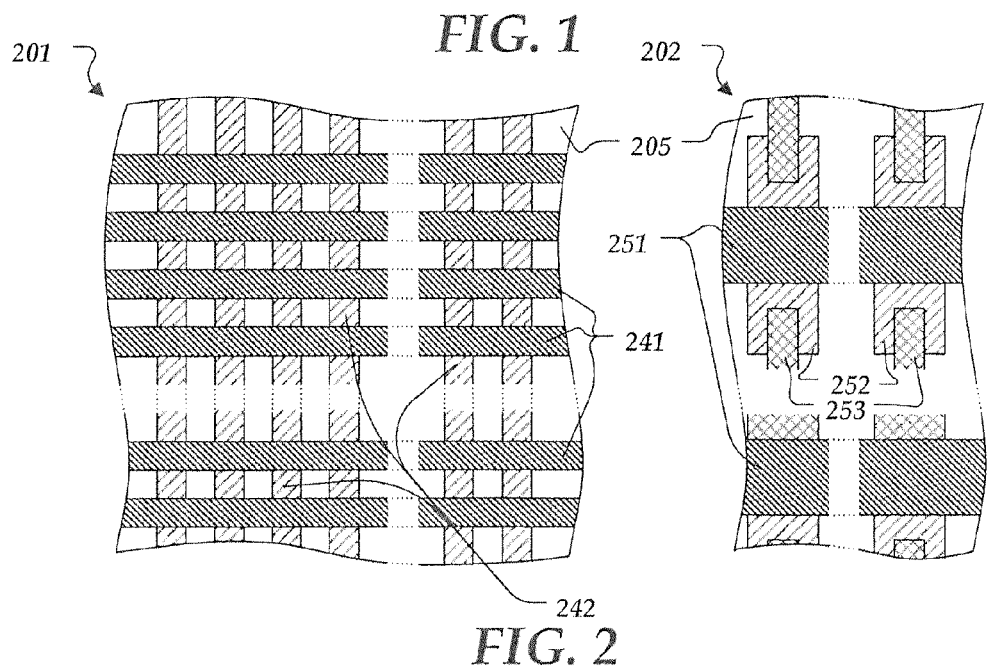
FIG. 2 shows a partial top plan view of an embodiment of core and peripheral sections of a memory that may be employed in the memory of FIG. 1.

FIG. 2 shows a partial top plan view of separate sections of a memory. Core section 201, for example, may be an embodiment of a portion of sector 120 of FIG. 1 and may include arrayed core memory cells. Peripheral section 202, for example, may be an embodiment of memory controller 110 of FIG. 1 or a portion of memory controller 110 of FIG. 1.

Core section 201 includes core polysilicon lines 241, conductive regions 242, and a portion of substrate 205. Portions of core polysilicon lines 241 are coupled to the gates of individual memory cells (not shown in FIG. 2) and can be configured as a word line, a source select gate line, and/or a drain select gate line. Portions of conductive regions 242 can include, for example, p-type and/or n-type doped regions of substrate 205 for forming source/drain regions and/or conductive lines. For example, conductive regions 242 can form portions of bit lines and/or other signal lines. Also, in some embodiments, individual conductive regions 242 extend at least partially underneath individual core polysilicon lines 241.

In one embodiment, core section 201 is arranged in a NOR topology, and individual memory cells can be individually accessed via individual conductive regions 242. In another embodiment, core section 201 is arranged in a NAND topology, and individual memory cells can be accessed through individual conductive regions 242 collectively but not individually. In other embodiments, hybrid architectures can be employed. For example, core section 201 can be configured to have a portion that is NAND-based and another portion that is NOR-based. Also, although not shown in FIG. 2, core section 201 may include any of a variety of interconnect and/or passivation layers, such as dielectric, conductive, or other layers. For example, conductive regions 242 can be positioned beneath a dielectric spacer layer.

Peripheral section 202 includes peripheral polysilicon lines 251, conductive regions 252, and interconnects 253. Portions of peripheral polysilicon lines 251 are coupled to individual peripheral devices (not shown in FIG. 2).

Portions of conductive regions 252 can include, for example, p-type and/or n-type doped regions of substrate 205 for forming conductive features, such as a source, a drain, or other type of well. Interconnects 253 can include conductive lines that electrically intercouple portions of peripheral section 202 and/or electrically couple core section 201 with peripheral section 202. For example, interconnects 253 can include a combination of metal lines and vias. Also, although not shown FIG. 2, peripheral section 202 may also include any of a variety of other interconnect and/or passivation layers.

Figure 3:
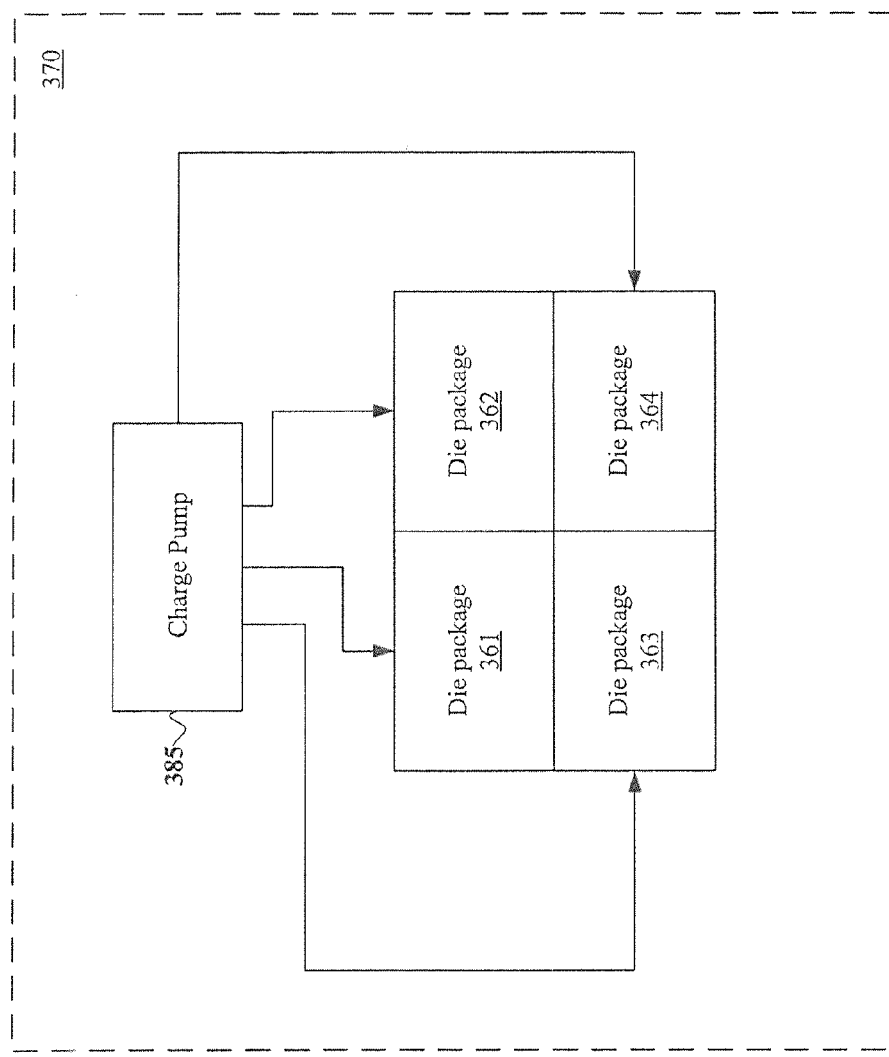
FIG. 3 illustrates a block diagram of a memory module that includes an embodiment of the memory of FIG. 1.

FIG. 3 illustrates a block diagram of an embodiment of memory module 370. Memory module 370 includes die packages 361-364 and charge pump 385. Although only four die packages are shown in FIG. 3, in various embodiments, memory module 370 may include many more die packages, such as 144 or more die packages in one embodiment. Memory module 370 may be a dual in-line memory module (DIMM) or the like. However, the invention is not so limited, and other types of memory modules may be employed.

Charge pump 385 is off-chip. Charge pump 385 is external to each of the die packages (e.g., 361-364) in memory module 370. Each of the die packages (e.g., 361-364) is an integrated circuit that includes a flash memory device, where the flash memory device may be memory device 100 of FIG. 1 or memory device 400 of FIG. 4. Charge pump 385 is arranged to provide a charge pump voltage that is selectively provided to the bit lines in each flash memory device of the die packages (e.g., die packages 361-364). Charge pump 385 may be directly coupled to the bit lines, or coupled via one or more intermediately devices, such as regulators, decoders, and/or the like, as illustrated in FIG. 4 in one embodiment.

In some embodiments, charge pump 385 is a discrete charge pump that is composed of discrete devices, including a discrete inductor.

Figure 4:
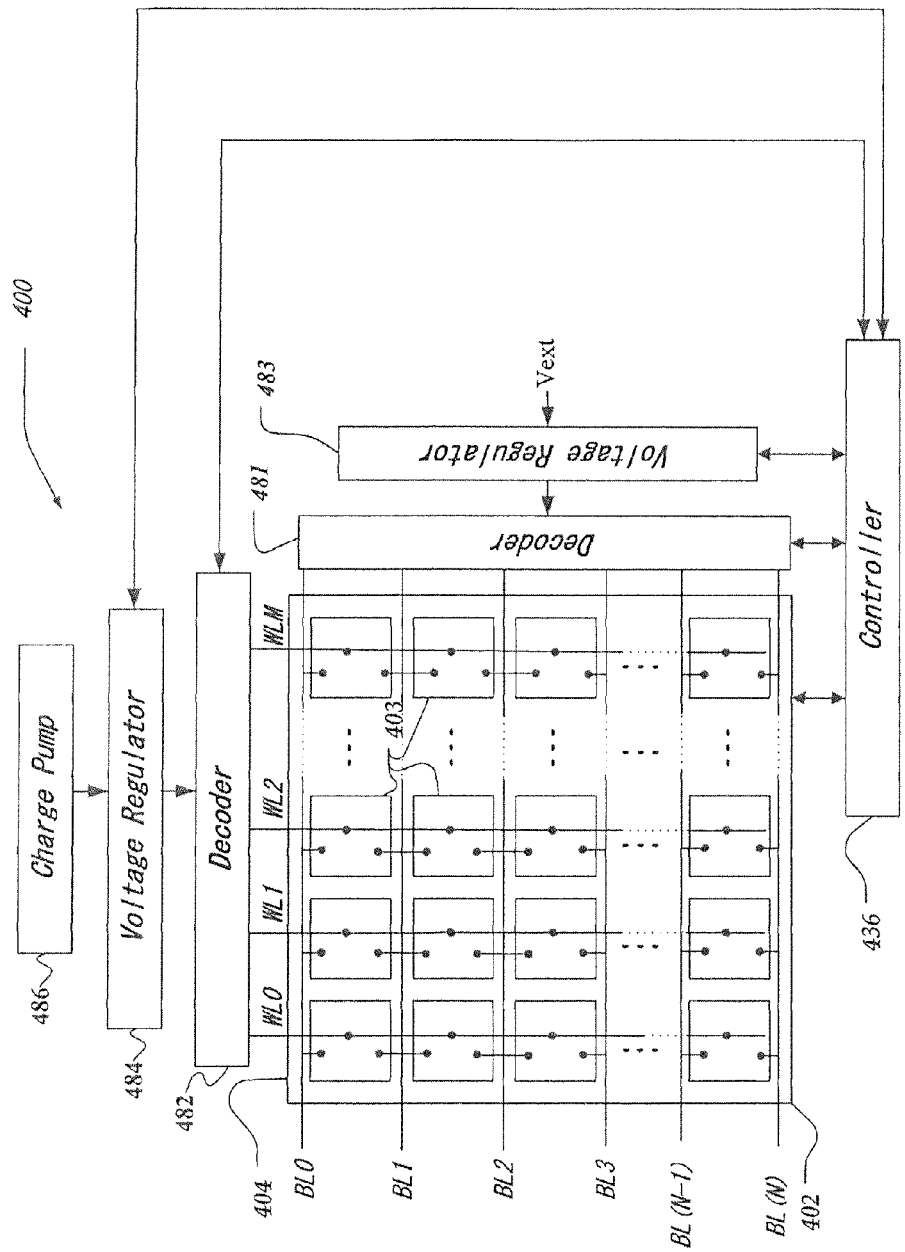
FIG. 4 shows a block diagram of an embodiment of the memory device of FIG. 1.

FIG. 4 illustrates a block diagram of an embodiment of memory device 400, which may be employed as an embodiment of memory device 100 of FIG. 1, and may be integrated within embodiments of one or more of the die packages 361-364 of FIG. 3. Memory device 400 includes memory array 402 and individual memory cells 403 located within memory array 402. Memory cells 403 are arranged in N+1 rows and M+1 columns in memory array 402. In one embodiment, each row of memory array 402 is accessed by two of the bit lines BL0 to BLN. Each column of memory array 402 is accessed by one of word lines WL0 to WLM. Accordingly, each of memory cells 403 can be accessed by activating the corresponding bit lines and a corresponding word line of the cell. In one embodiment, each column of memory array 402 defines a data word. If N+1 has a value of 8, for example, the cells in each column of memory array 402 define a byte of data.

Memory cells 403 may be flash memory cells which store bits in different ways in different embodiments. In various embodiments, a single cell may store one or more bits. For example, some memory cells are single cell devices, some memory cells are dual cells devices, and in some embodiments, more than one distinct level of threshold voltage may be used to represent more than one bit per cells, as discussed in greater detail below. In some embodiments, flash memory stores information in an array of memory cells made from floating-gate transistors. In, for example, a NOR gate flash, the transistors resemble a standard metal-oxide-semiconductor field-effect transistor ("MOSFET") except that the transistor has two gates, a floating gate and a control gate, instead of one. On top is the control gate ("CG"), as in other metal-oxide-semiconductor transistors, but below this there is a floating gate ("FG") insulated all around by an oxide layer. The FG is interposed between the CG and the MOSFET channel. Because the FG is electrically isolated by an insulating layer, any electrons placed on it are trapped there and, under normal conditions, will not discharge for many years. When the FG holds a charge, it screens (partially cancels) the electric field from the CG, which modifies the threshold voltage ("$V_T$") of the cell. The threshold voltage of a MOSFET is usually defined as the gate voltage where an inversion layer forms at the interface between the insulating layer (oxide) and the substrate (body) of the transistor. During read-out, a voltage is applied to the CG, and the MOSFET channel will become conducting or remain insulating, depending on the $V_T$ of the cell, which is in turn controlled by the charge on the FG. The current flow through the MOSFET channel is sensed which permits a determination of the voltage threshold for the device, which in turn provides information about the binary data stored within the device.

In a single cell device, each control gate of a transistor stores a single charge amount that represents the stored information. In its default or "un-programmed" state, it is logically equivalent to a binary "1" value, because current will flow through the channel under application of an appropriate voltage to the control gate.

In a dual cell device, each control gate stores two charge amounts that represent the stored information. That is, two physically distinct quantities of charge are stored on opposite sides of the floating gate. Reading or writing data on one side of the floating gate occurs independently of the data that is stored on the opposite side of the floating gate. In this technology, the FG is split into two mirrored or complementary parts, each of which is formulated for storing independent information. Each dual cell, like a traditional cell, has a gate with a source and a drain. However, in the dual cell the connections to the source and drain may be reversed in operation to permit the storage of the two bits. Each of the memory cells is comprised of multi-layers. A charge-trapping dielectric layer is formed over a semiconductor substrate. The charge-trapping dielectric layer can generally be composed of three separate layers: a first insulating layer, a charge-trapping layer, and a second insulating layer. Word-lines are formed over the charge-trapping dielectric layer substantially perpendicular to the bit lines. Programming circuitry controls two bits per cell by applying a signal to the word-line which acts as a control gate, and changing bit line connections such that one bit is stored by the source and drain being connected in one arrangement and the complementary bit is stored by the source and drain being connected in another arrangement.

In a single-level cell ("SLC") device, each cell stores only one bit of information, either the cell is "un-programmed" (has a "1" value) or "programmed" (has a "0" value). There also exist multi-level cell ("MLC") devices that can store more than one bit per cell by choosing between multiple levels of electrical charge to apply to the floating gates of its cells. In these devices, the amount of current flow is sensed (rather than simply its presence or absence), to determine more precisely the level of charge on the FG.

As an example, a dual cell device may also be a MLC device that stores four-bits-per-cell so that one transistor equates to 16 different states. This enables greater capacity, smaller die sizes and lower costs for the flash devices.

Memory device 400 further includes controller 436, decoder 481, decoder 482, voltage regulator 483, voltage regulator 484, and charge pump 486.

An external voltage, Vext, from an external charge pump (e.g., charge pump 385 of FIG. 3) is received by memory device 400. Charge pump 486 is arranged to provide a boosted word line voltage. Voltage regulator 483 is arranged to receive the boosted voltage from charge pump 485, and to provide an adjusted boosted bit line voltage based on control from controller 436. Similarly, voltage regulator 484 is arranged to receive the boosted voltage Vext from the external charge pump (e.g., charge pump 386 of FIG. 3), and to provide an adjusted boosted word line voltage based on control from controller 436. In other embodiments, voltage regulators 483' and 483 may be omitted from memory device 400, and the boosted voltages may be provided directly to the decoders.

As discussed above, in various embodiments, the boosted word line voltage may be provided by either an integrated charge pump, with one integrated charge pump per die package providing the boosted word line voltage for each die package, or in other embodiments the boosted word line voltage may be provided by an external charge pump in the same manner that the boosted bit line voltage is provided, with an external charge pump that provides the boosted word line voltage to each of the die packages.

Decoder 481 and decoder 482 can each receive address bus information from controller 436 and can utilize such information to facilitate accessing or selecting the desired memory cell(s) (e.g., memory location(s)) associated with the command, and to provide the needed voltages to the bit lines (decoder 481) and the word lines (decoder 482) according to timing that is controlled by controller 436.

Decoder 481 may also include a sector decoder in some embodiments. As such, decoder 409 may be arranged to facilitate accessing or selection particular column or grouping of columns within memory device 400. For example, a grouping of columns may define a sector, and another grouping of columns may define another sector. In another embodiment, portion 401 may include an array decoder for a particular memory array 404. In addition, embodiments of array decoders can be configured to work separately or in conjunction with a sector decoder.

Memory controller 436 is also configured to control the activation and de-activation individual word lines WL0 to WLM for reading, writing, and/or erasing to memory array 402. For example, memory controller 410 can provide a select signal to decoder 482 to select one of the columns WL1 to WLM to activate that column. Further, memory controller 436 can provide a select signal to decoder 481 for selecting particular rows BL0 to BLN (or sector) to be written to or read from.

Although FIG. 4 illustrates that the bit line voltage is provided externally and the word line voltage is provided internally, in some embodiments, as previously discussed, the word line voltage may also be provided externally in a similar manner that the bit line voltage is provided externally. The embodiments and others are within the scope and spirit of the invention.

Modern semiconductor devices are typically created as integrated circuits manufactured on the surface of a substrate of semiconductor material. The processing begins by growing a wafer, which is typically done using the Czochralski process. Various devices are formed on the wafer using a series of steps that include deposition, removal processes (such as etching), patterning, and doping. Few steps or many hundreds of such steps may be used in various designs. The patterning steps may be performed by photolithography or other lithographic methods. For example, the wafer may be coated with a photoresist, which is exposed with a device that exposes light through photomasking, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design. Various design tools may be used by the designer in creating the design, simulating the design, and checking the design for layout rules violations. When completed, the design files are provided to the fabricator, which are used to generate photomasks for use in fabricating the device. The design files may be communicated in different ways, including over a network.

Figure 5:
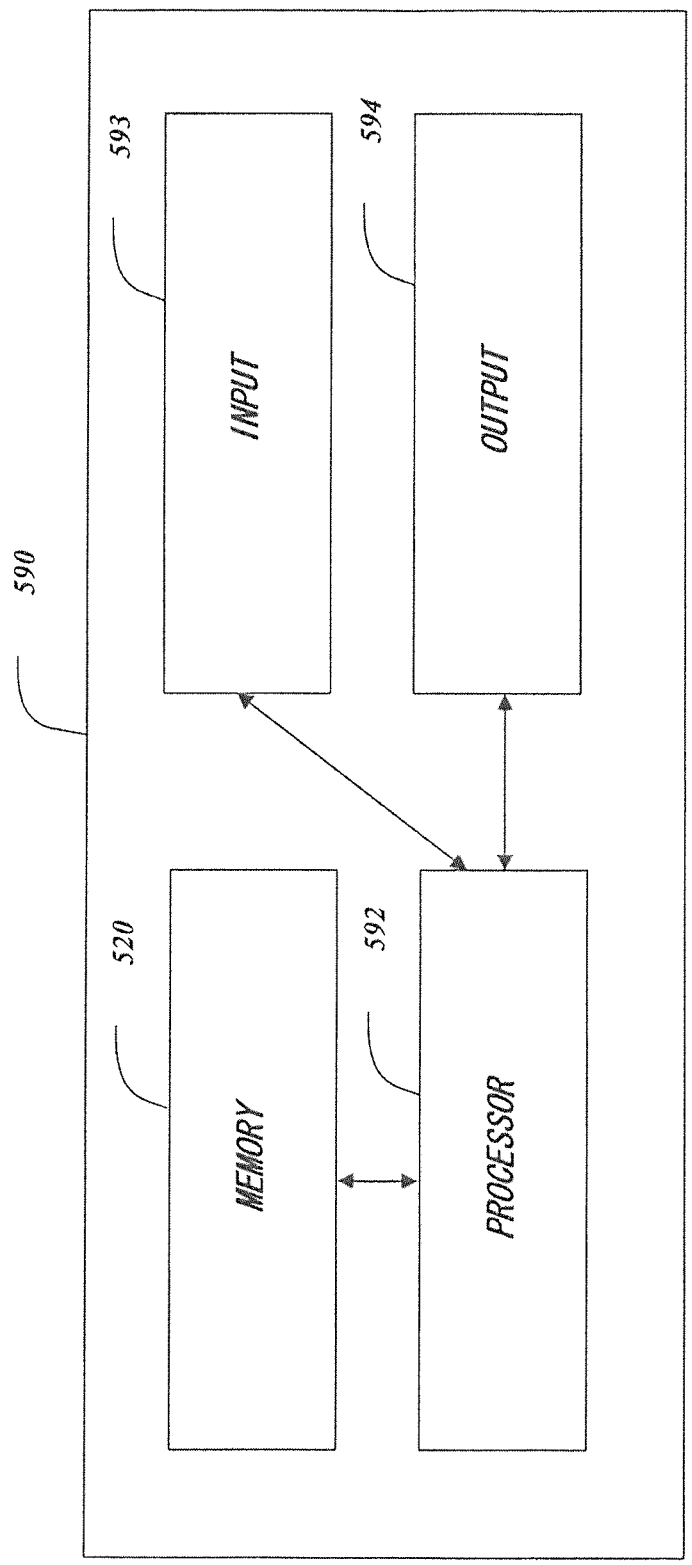
FIG. 5 illustrates a block diagram of an embodiment of a system that includes the memory device of FIG. 4, in accordance with aspects of the invention.

Embodiments of memory device 400 of FIG. 4 can be incorporated into any of a variety of components and/or systems, including for example, a processor and other components or systems of such components. FIG. 5 shows one embodiment of system 590, which may incorporate memory 520, which is an embodiment of memory device 400 of FIG. 4 and/or memory module 370 of FIG. 3. Memory 520 can be directly or indirectly connected to any one of processor 592, input devices 593, and/or output devices 594. In one embodiment, memory 520 may be configured such that it is removable from system 590. In another embodiment, memory 520 may be permanently connected to the components or a portion of the components of system 590.

In many embodiments, memory 520, processor 592, input devices 593, and/or output devices 594 of system 590 are configured in combination to function as part of a larger system. For example, system 590 may be incorporated into a cell phone, a handheld device, a laptop computer, a personal computer, and/or a server device. In addition or alternatively, system 590 can perform any of a variety of processing, controller, and/or data storage functions, such as those associated with sensing, imaging, computing, or other functions. Accordingly, system 590 can be incorporated into any of a wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. An apparatus, comprising:
a memory module, including:
a plurality of die packages, at least one die package from among the plurality of die packages including a flash memory device and an integrated charge pump, the flash memory device being associated with a plurality of bit lines and a plurality of word lines;
a memory controller;
an external charge pump that is external to the memory controller and external to the at least one die package, the external charge pump being configured to provide an external voltage; and
a first voltage regulator configured to selectively provide the external voltage to at least one bit line from among the plurality of bit lines, wherein
the integrated charge pump is configured to provide an integrated voltage, and
a second voltage regulator is configured to selectively provide the integrated voltage to at least one word line from among the plurality of word lines.

2. The apparatus of claim 1, wherein the memory module is a dual in-line memory module.

3. The apparatus of claim 1, wherein the first voltage regulator is configured to adjust the external voltage to selectively provide the external voltage to the at least one bit line.

4. The apparatus of claim 1, wherein the flash memory device includes a bit line decoder configured to determine the at least one bit line that is to be provided with the external voltage.

5. The apparatus of claim 3, wherein the first voltage regulator is configured to adjust the external voltage based on a signal from the memory controller.

6. The apparatus of claim 1, wherein the integrated charge pump is configured to provide a boosted voltage as the integrated voltage.

7. The apparatus of claim 1, wherein the external charge pump is a discrete charge pump.

8. The apparatus of claim 7, wherein the external charge pump includes a discrete inductor.

9. A method, comprising:
providing a plurality of die packages in a memory module, at least one die package from among the plurality of die packages including a flash memory device and an integrated charge pump, the flash memory device being associated with a plurality of bit lines and a plurality of word lines;
providing a memory controller;
selectively providing an external voltage from an external charge pump to at least one bit line from among the plurality of bit lines in the flash memory device, the external charge pump being external to the memory module and external to the at least one die package; and
selectively providing an integrated voltage from the integrated charge pump to at least one word line from among the plurality of word lines.

10. The method of claim 9, wherein the selectively providing the external voltage includes selectively providing the external voltage to the at least one bit line via a voltage regulator.

11. The method of claim 9, wherein the selectively providing the external voltage includes selectively providing the external voltage to the at least one bit line via a decoder.

12. The method of claim 9, wherein the selectively providing the external voltage includes selectively providing the external voltage to the at least one bit line via a voltage regulator and a bit line decoder.

\* \* \* \* \*